(12) United States Patent
Yen et al.

(10) Patent No.: US 7,969,580 B2
(45) Date of Patent: Jun. 28, 2011

(54) METHOD AND SYSTEM FOR STEP-AND-ALIGN INTERFERENCE LITHOGRAPHY

(75) Inventors: Jia-Yush Yen, Taipei (TW); Shuo-Hung Chang, Taipei County (TW); Cheng-Hung Chen, Changhua (TW); Lien-Sheng Chen, Banciao (TW)

(73) Assignee: Industrial Technology Research Institute, Hsin-Chu (TW)

( * ) Notice: Subject to any disclaimer, the term of this patent is extended or adjusted under 35 U.S.C. 154(b) by 354 days.

(21) Appl. No.: 12/266,668

(22) Filed: Nov. 7, 2008

(65) Prior Publication Data

US 2009/0323078 A1 Dec. 31, 2009

(30) Foreign Application Priority Data

Jun. 26, 2008 (TW) .............................. 97123876 A

(51) Int. Cl.
*G01B 11/02* (2006.01)
(52) U.S. Cl. ...................................................... 356/500
(58) Field of Classification Search .................. 356/500
See application file for complete search history.

(56) References Cited

U.S. PATENT DOCUMENTS 6,329,104 B1 * 12/2001 Clube et al. ....................... 430/1
6,882,477 B1    4/2005  Schattenburg et al.

* cited by examiner

*Primary Examiner* — Tarifur Chowdhury
*Assistant Examiner* — Jonathon D Cook
(74) *Attorney, Agent, or Firm* — Tim Tingkang Xia; Morris, Manning & Martin, LLP

(57) ABSTRACT

A method for step-and-align interference lithography is provided in the present invention, by which a displacement error relating to the moving of an interference light beam as the source of the interference light beam is being carried to move by a carrier is measured before interference lithography, and then the displacement error is used as a reference to compensate a positioning error between adjacent interference patterns during step-and-align interference lithography. Besides, the present invention further provides a system for step-and-align interference lithography, which is capable of compensating the positioning error caused by a stepping movement control used for moving a substrate or the light beams in a stepwise manner to form interference-patterned regions by interference lithography and thus the so-generated interference-patterned regions are accurate aligned with one another on a two-dimensional plane for preparing the same to be stitched together to form a two-dimensional large-area periodic structure.

5 Claims, 15 Drawing Sheets

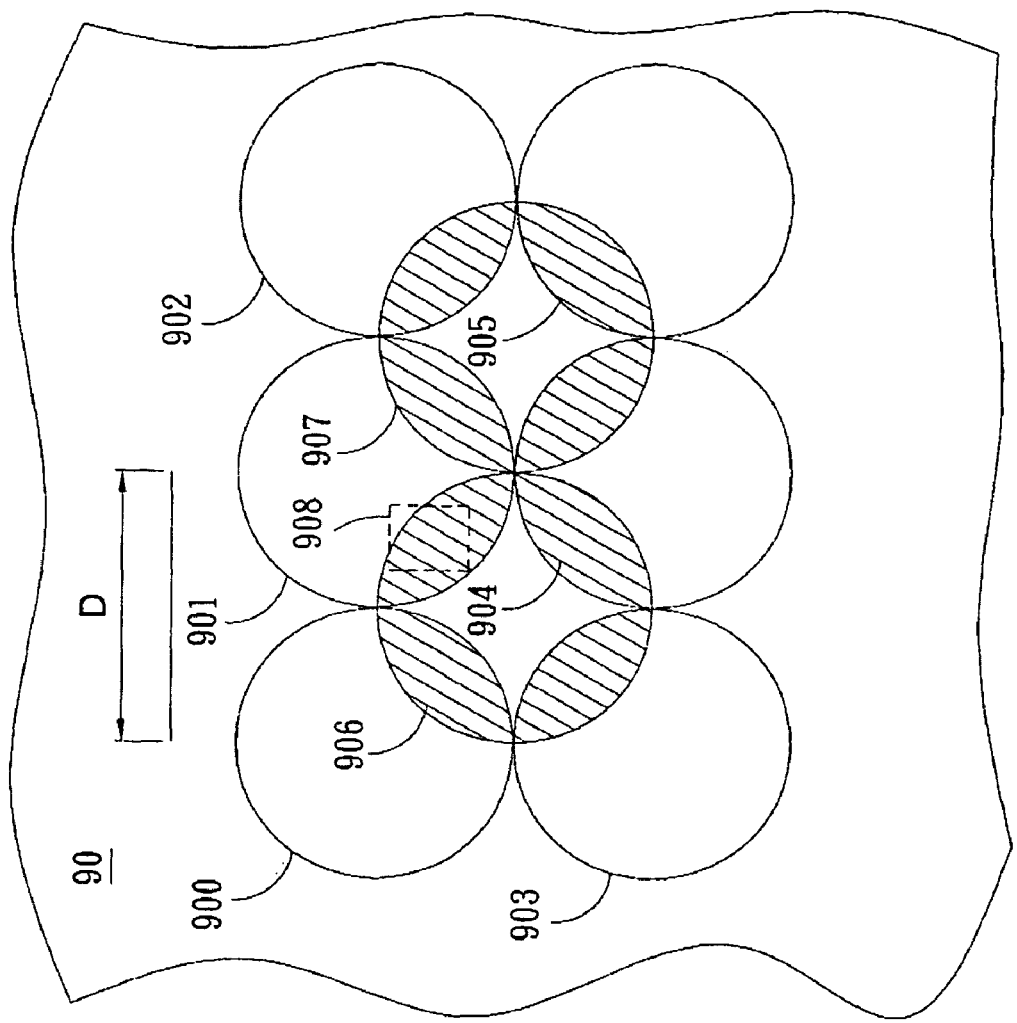
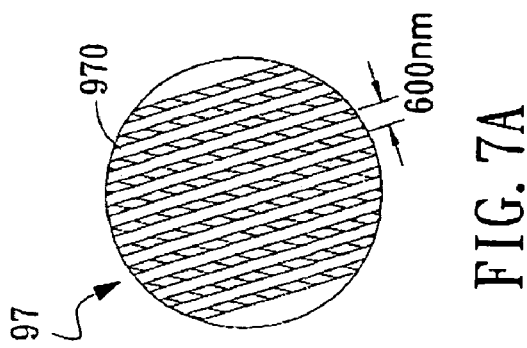
FIG. 7A
FIG. 7B

METHOD AND SYSTEM FOR STEP-AND-ALIGN INTERFERENCE LITHOGRAPHY

FIELD OF THE INVENTION

The present invention relates to an interference lithography (IL) technology, and more particularly, to a step-and-align IL method and system with positioning error compensation ability.

BACKGROUND OF THE INVENTION

Recently, with the increasing demand of large-area applications in displays, flexible electronic devices and solar cells, it is required that opto-electronic devices are manufactured in large area by the composition of periodic sub-structures whose critical dimensions are preferred to be the smaller the better. It is predictable that there will be more and more manufacturers focusing their effort on submicron-scaled, or even nano-scaled periodic structures. However, to achieve such submicron-scaled, or nano-scaled periodic structures, it is important to have an alignment device capable of positioning in nano-scaled precision, which is especially true for trying to manufacture a large-area device with microstructures by a means of interference lithography as it requires multiple exposures and stitches. Therefore, it is crucial to have a stable alignment device capable of traveling in long stroke while positioning in nano-scaled precision.

There are already many studies relating to such effort. One of which is a method and system for interference lithography utilizing phase-locked scanning beams, disclosed in U.S. Pat. No. 6,882,477. The invention utilizes a high-precision stage that moves a substrate under overlapped and interfering pairs of coherent beams, and thus generates fringes, which form a pattern "brush" for subsequent writing of periodic patterns on the substrate, while altering the phases of the coherent beams by the use of an acousto-optic modulator (AOM) so as to enable the phase of the fringes in the overlapped region to be phase-locked, and thus produce periodic structures in large area with interference fringes of critical period and line width. As the phase-lock is ensured by the use of acousto-optic modulator (AOM), the aforesaid method is operational even under the influence of high-frequency external noises. In addition, as the positioning of the aforesaid patent is not performed by a mechanical mechanism, the platform for the aforesaid interference lithography method can enjoy a comparatively longer lifespan.

As the use of non-mechanical mechanism for aligning and positioning is common in prior arts, only a few efforts exist to develop a mechanism positioning device, especially in the field of interference lithography. Generally, any currently available positioning device either is capable of traveling in long stroke but with low positioning precision, or is capable of positioning with high precision but only in short stroke. Although following the progress of motor control technique and the advance of fabrication process for mechanical parts, those long-stroke, low-precision positioning device, represented by a device composed of motors and screw rods that is designed with a stroke of about 200 mm, can achieve micron-scaled or even submicron-scaled positioning accuracy, their precisions are still not good enough for manufacturing microstructures whose critical dimensions are smaller than submicron.

As for the short-stroke, high-precision positioning device being represented by a piezoelectric actuator, it utilizes the principle that the deformation of a piezoelectric material is in direct proportion with the voltage exerted thereon for driving a platform to move in response to the variation of the voltage. Moreover, if the piezoelectric actuator is controlled by a digital control device, the minimum displacement of the platform caused by the piezoelectric actuator is determined by the resolution of a digital-to-analog converter of the digital control device, i.e. the higher resolution the digital-to-analog converter are configured with, the more delicate response the piezoelectric material can be enabled to react. In addition, as the piezoelectric material can respond very fast to an applied voltage, it allows the piezoelectric actuator to have relatively high bandwidth. From the above description, it is concluded that the mobile platform which uses a piezoelectric material as actuator is suitable to be configured for compensating positioning error and also for suppressing the adverse affection of ambient vibrations working on the whole mobile platform system. However, such mobile platform of piezoelectric actuator is only capable of traveling in a very short stroke, which can be no more than 0.5 mm in general.

Please refer to FIG. 1A and FIG. 1B, which are schematic diagrams showing the alignment of two patterns of microstructures in two different manners. In FIG. 1A, the pattern 10, being formed on a workpiece 1 by lithography, is moved in a stepwise manner following a Y direction defined by a Cartesian coordinate system of X-axis and Y-axis so as to be aligned and thus stitched with another pattern 11 formed next to the pattern 10. As shown in FIG. 1A, the fringes within the ranges of the pattern 10 and pattern 11 are aligned parallel with the Y direction so that the two patterns can be aligned perfectly for stitching the two together. However, in most case, the fringes within the ranges of the two patterns are usually not aligned perfectly parallel along with their moving direction, as those shown in FIG. 1A, but are aligned as those shown in FIG. 1B, especially when the patterns are nano-scaled patterns. In FIG. 1B, the fringes in the pattern 12 are deflected from the Y direction by a specific angle, which is caused by the positioning error of the interference beams during calibration. Thereby, as another pattern 13 is formed next to the pattern 12 at a side thereof, the fringes will not be aligned perfectly and thus there are positioning error between adjacent interference patterns 12, 13 during step-and-align interference lithography.

SUMMARY OF THE INVENTION

The object of the present invention is to provide a method for step-and-align interference lithography, by which a displacement error relating to the moving of interference light beams is measured before interference lithography, and then the displacement error is used as a reference to compensate a positioning error between adjacent interference patterns during step-and-align interference lithography, and thereby, the so-generated interference-patterned regions are accurate aligned with one another on a two-dimensional plane for preparing the same to be stitched together in high precision.

Another object of the invention is to provide a system for step-and-align interference lithography, which is capable of compensating the positioning error caused by a stepping movement control used for moving a substrate or the light beams in a stepwise manner so as to form a plurality of interference-patterned regions by interference lithography and thus the so-generated interference-patterned regions are accurate aligned with one another on a two-dimensional plane for preparing the same to be stitched together to form a two-dimensional large-area periodic structure.

In an exemplary embodiment, the present invention provides a method for step-and-align interference lithography, which comprises the steps of: (a) providing a carrier capable of moving in a first axial direction and a second axial direction as well as rotating about the same; (b) providing an interference light beam while detecting a displacement error of the interference light beam relating to the moving of the carrier; (c) enabling the interference light beam to project on a workpiece mounted on the carrier for forming a specific interference-patterned region on the workpiece; (d) performing a position adjustment according to the displacement error in a stepwise manner so as to prepare the workpiece for a next formation of interference-patterned region; and (e) repeating the execution of the step (c) to step (d) for multiple times so as to form a large-area interference pattern by stitching the so-generated interference-patterned regions together.

In another exemplary embodiment, the present invention provides a system for step-and-align interference lithography, which comprises: a carrier, provided for a workpiece to be mounted thereon and being configured with a first reflecting element and a second reflecting element in a manner that the two reflecting elements are arranged at two opposite sides of the carrier; a position detecting unit, arranged at a side of the carrier, capable of using the detection of the first and the second reflecting elements with respect to the position of the carrier to generate a position signal; a stage driving unit, coupled to the carrier in a manner that it is used for controlling the carrier to move in a first axial direction and a second axial direction as well as rotating about the same; an interference lithography unit, for providing an interference light beam to be used for performing an interference lithography process on the workpiece; and a signal processing unit, coupled to the position detecting unit and the stage driving unit for receiving and thus processing the position signal so as to generate a position control signal; wherein, the signal processing signal is enabled to calculate a positional compensation basing upon the position control signal and a displacement error relating to the moving of the interference light beam with respect to the second axial direction and then control the stage driving unit to perform a movement according to the position compensation so as to adjust the position of the workpiece for the interference lithography process.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 7A is a schematic diagram showing an interference pattern of an interference lithography process performed by an interference lithography system of the invention.

FIG. 7B is a schematic diagram showing a plurality of interference patterns formed from a series of continuous interference lithography processes performed by an interference lithography system of the invention.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows. Please refer to FIG. 2A, which is a flow chart depicting the steps of a method for step-and-align interference lithography according to an exemplary embodiment of the invention. The method starts from step 20. At step 20, a carrier capable of moving in a first axial direction and a second axial direction as well as rotating about the same is provided, which is used for carrying a substrate for interference lithography whereas the substrate can be made of a silicon material, but is not limited thereby; and then the flow proceeds to step 21. At step 21, an interference light beam is provided and further g a displacement error of the interference light beam relating to the moving of the carrier is also being detected; and then the flow proceeds to step 22. In an exemplary embodiment, the aforesaid step 21 further comprises the steps shown in the flow chart of FIG. 2B. In FIG. 2B, the flow starts from the step 210. At step 210, a position sensor is being lay on the carrier; and then the flow proceeds to step 211. At step 211, a first beam of the interference light beam is projected on the position sensor for forming a lighting area thereon and thereafter registering a first position relating to the lighting area; and then the flow proceeds to step 212.

Figure 3:
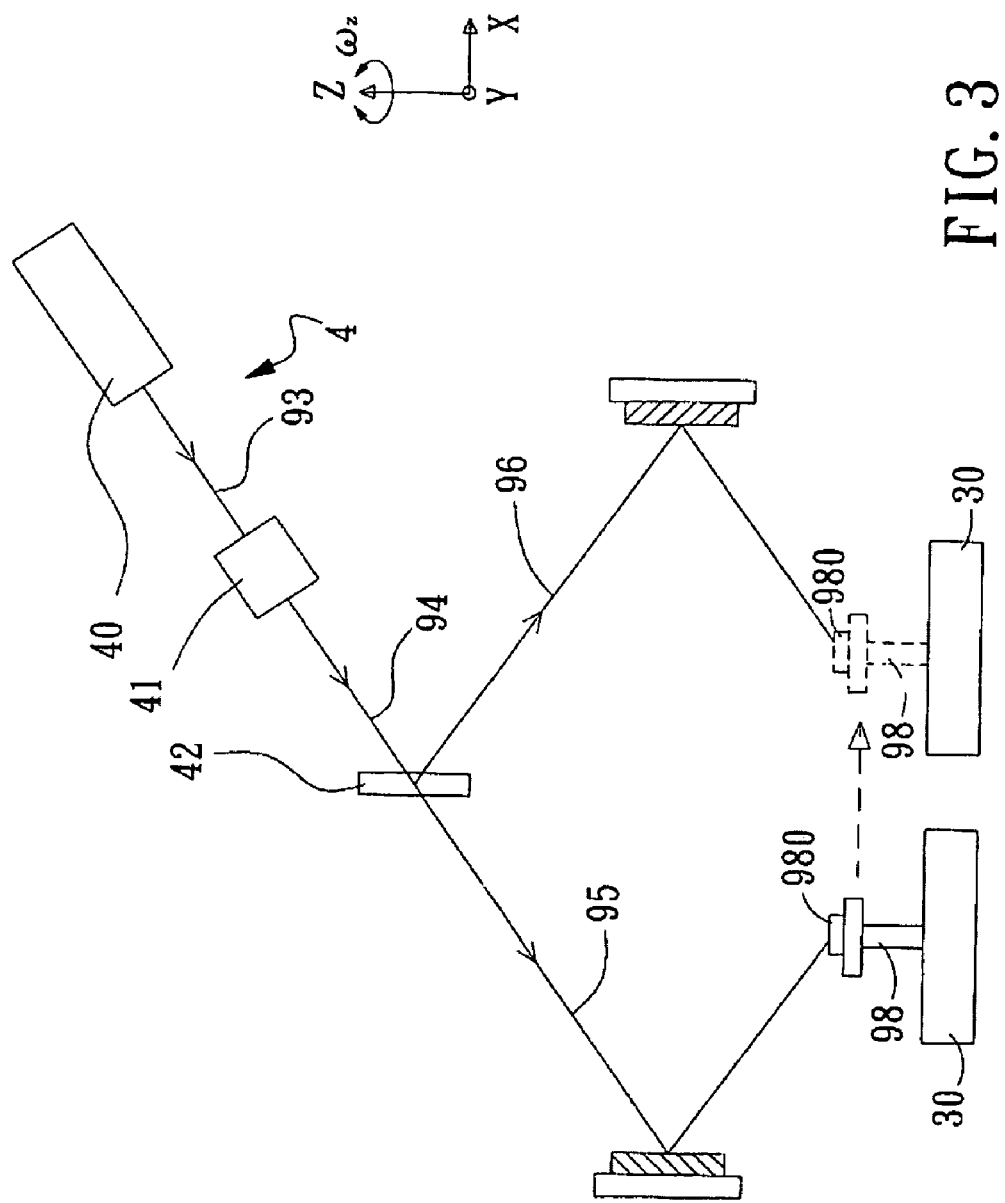
FIG. 3 is a schematic diagram showing how a position sensor is moved in a system for step-and-align interference lithography of the invention so as to be used for detecting a displacement error.
Figure 4:
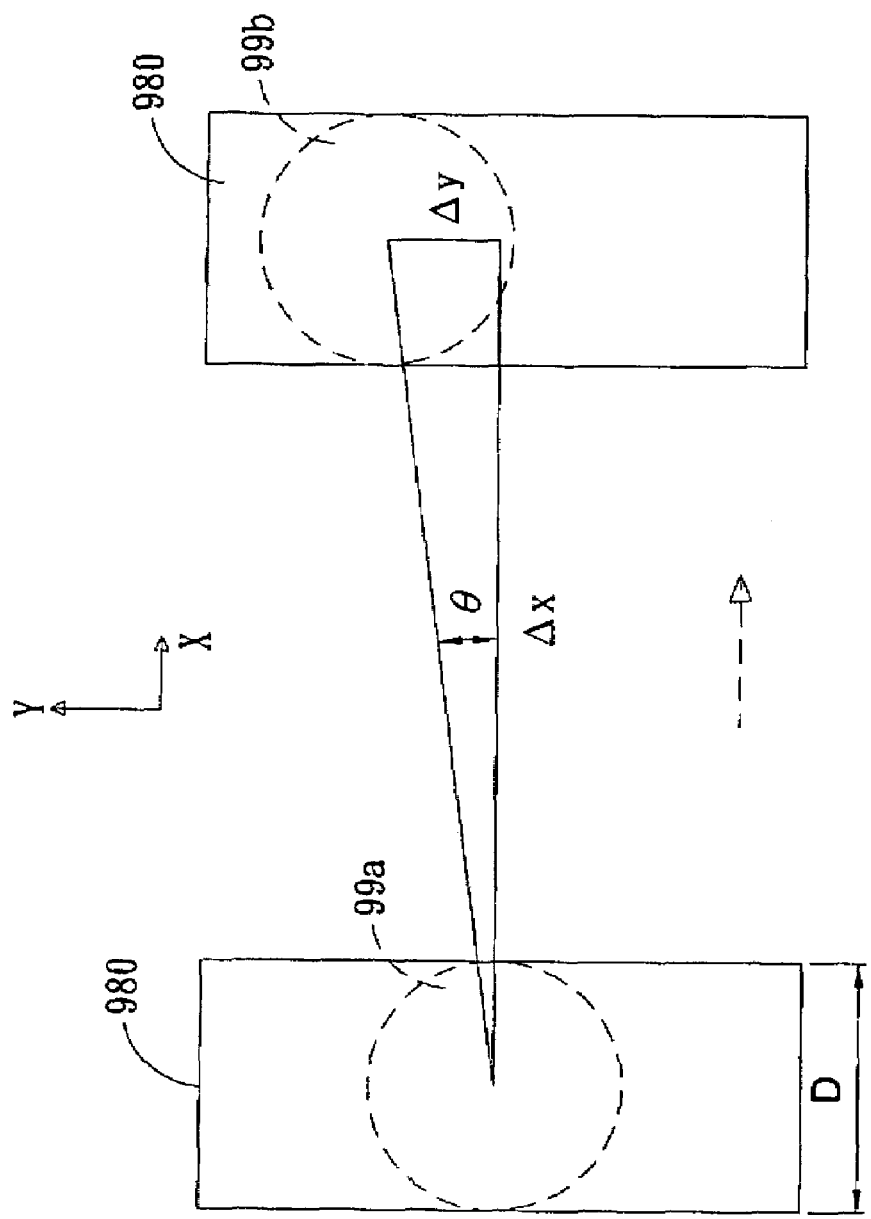
FIG. 4 is a schematic diagram showing how a displacement error is calculated and obtained according to an exemplary embodiment of the invention.

As shown in FIG. 3, the interference light beam used in the step 211 is emitted from a light source comprising: a beam generator 40, for emitting a beam 93; a beam shaper 41; and a beam splitter 42. In an exemplary embodiment, the beam generator 40 can be a laser generator. In FIG. 3, after the beam 93 is being converted by the beam shaper 41 into a shaped beam 94, it is being projected toward the beam splitter 42 where it is first being divided into a first beam 95 and a second beam 96, and then being directed to shine on a workpiece. Moreover, as there is a position sensor 980 being disposed on the carrier 30 by a supporting element 98, the first beam 95 will shine on the position sensor 980. For reducing any positioning error from happening, the diameter of a lighting region 99a resulting from the projection of the first beam 95 is equal to the width D of a sensing area of the position sensor 980, as shown in FIG. 4.

At step 212, the carrier is controlled to move a specific distance along the first axial direction while registering a second position relating to a lighting area being formed by projecting a second beam of the interference light beam on the position sensor; and then the flow proceeds to step 213. That is, by the moving of the carrier 30, the position sensor 980 is moved to a position where the second beam 96 is projected, as shown in FIG. 3. At step 213, a position difference between the first and the second position with respect to the second axial direction is calculated and thus obtained; and then the flow proceeds to step 214. As shown in FIG. 4, the positions of light regions 99a and 99b of the position sensor 980, respectively resulting from the projection of the first and the second beams, will not be the same if there is a displacement error during the moving of the carrier, whereas the position difference Δy measured along the Y direction can be obtained by the aforesaid step 213, as shown in FIG. 4. Finally, the step 214 is performed, in which the ratio between the displacement error and the specific distance is calculated and then the positioning error can be obtained basing upon the ratio. As shown in FIG. 4, the specific distance Δx is a known value and the position difference Δy has already been obtained from step 213, so that the displacement error is defined as the ratio between position difference Δy and position difference Δx.

Figure 1B:
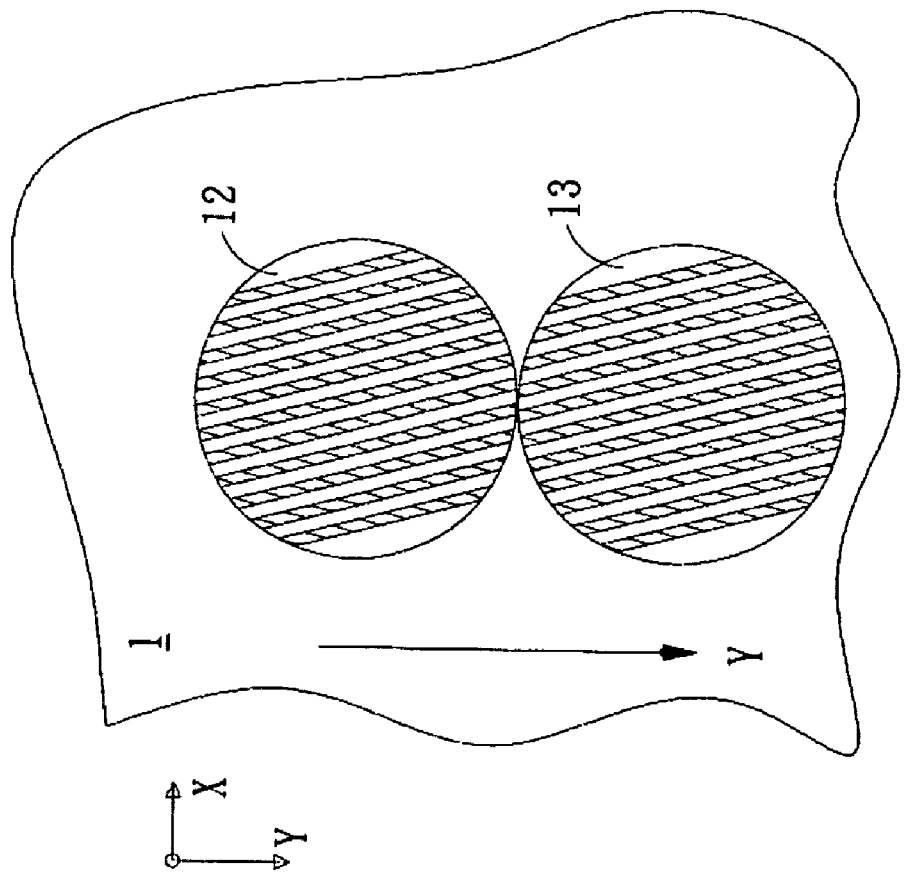
FIG. 1A and FIG. 1B are schematic diagrams showing the alignment of two patterns of microstructures in two different manners.
Figure 1A:
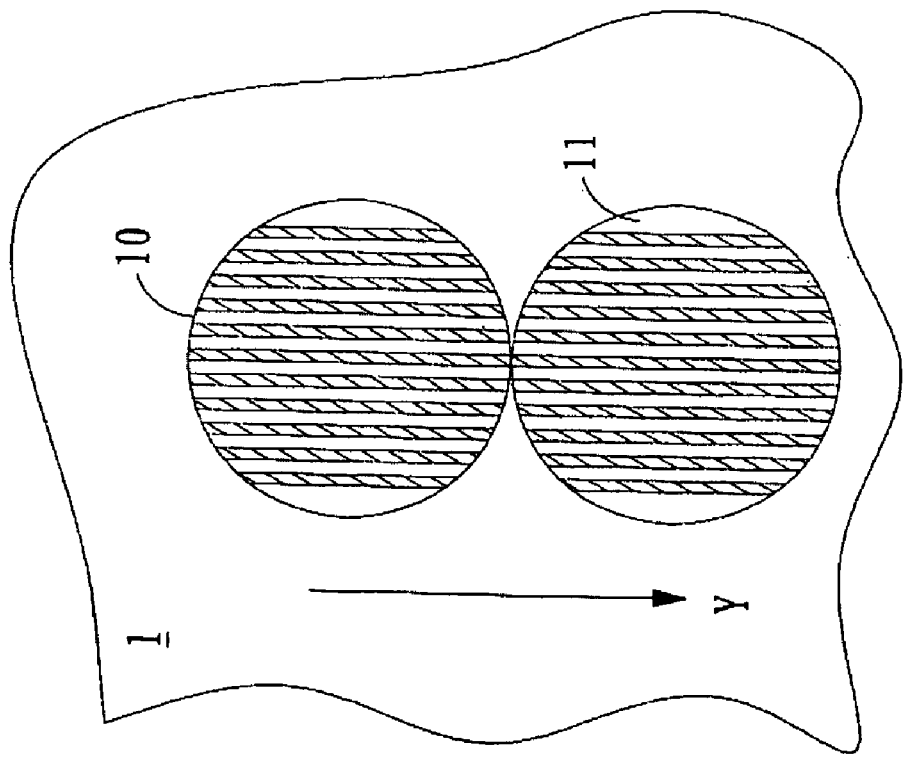
Figure 2A:
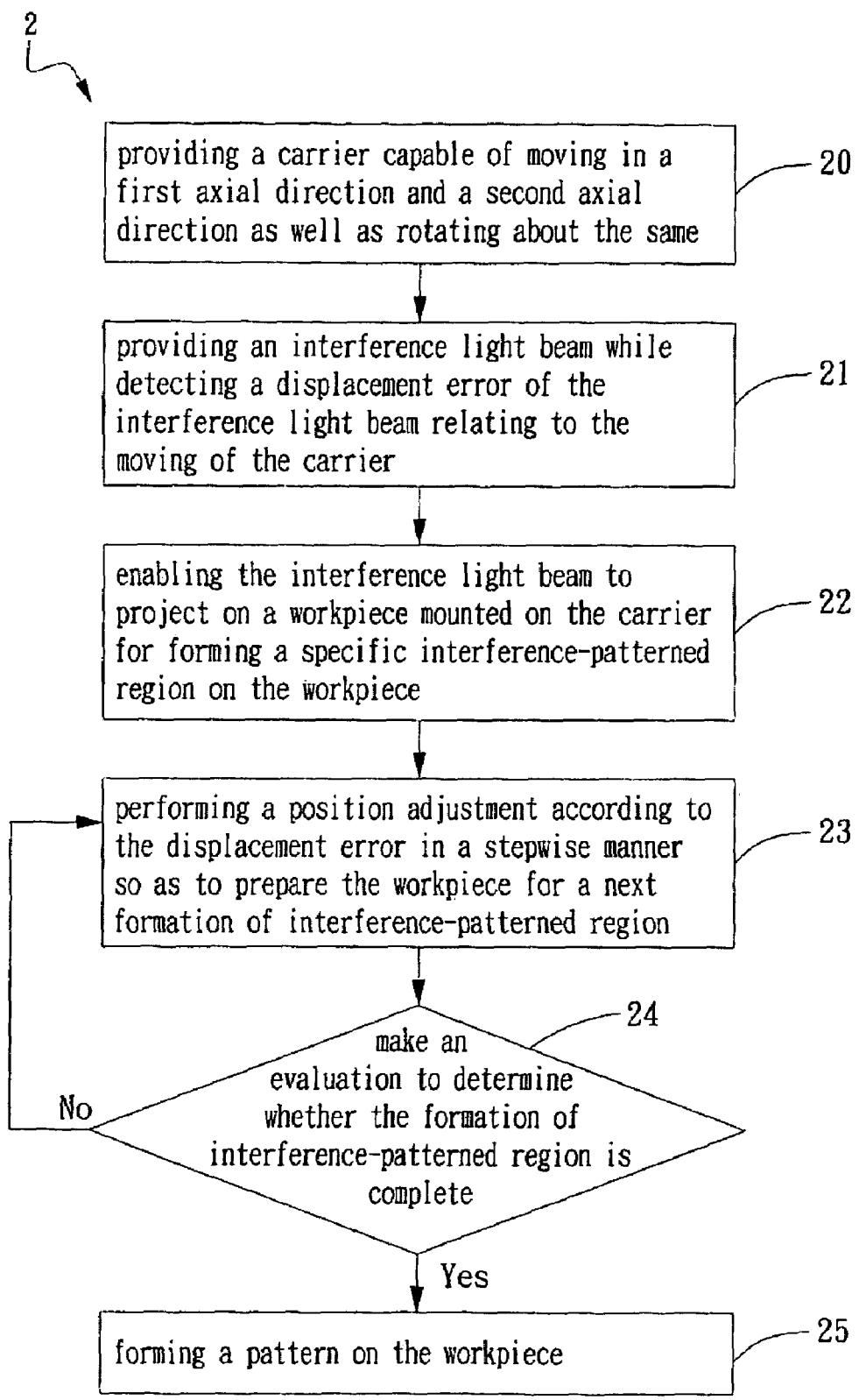
FIG. 2A is a flow chart depicting the steps of a method for step-and-align interference lithography according to an exemplary embodiment of the invention.
Figure 2B:
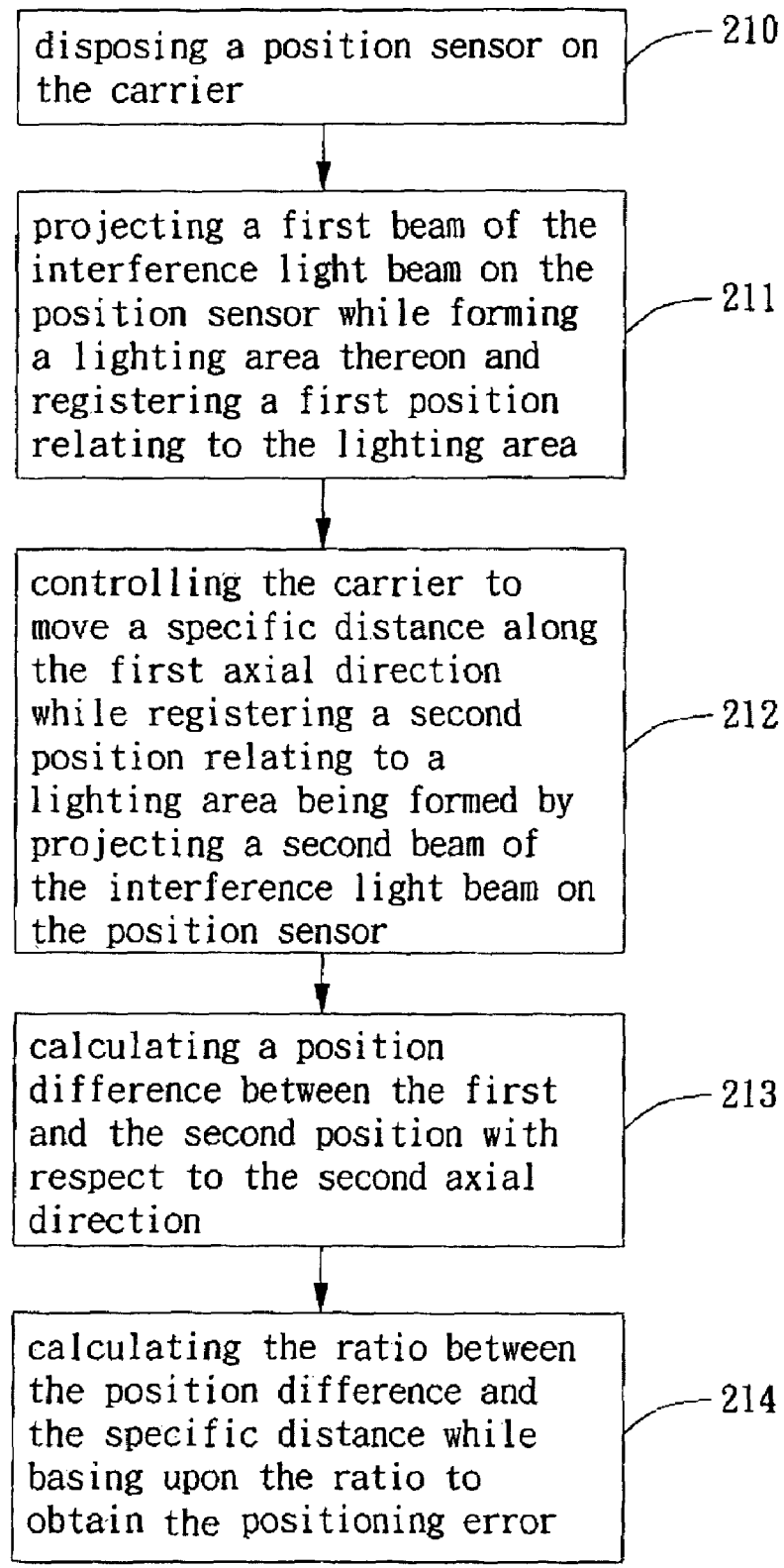
FIG. 2B is a flow chart depicting the steps for detecting a displacement error according to an exemplary embodiment of the invention.
Figure 5:
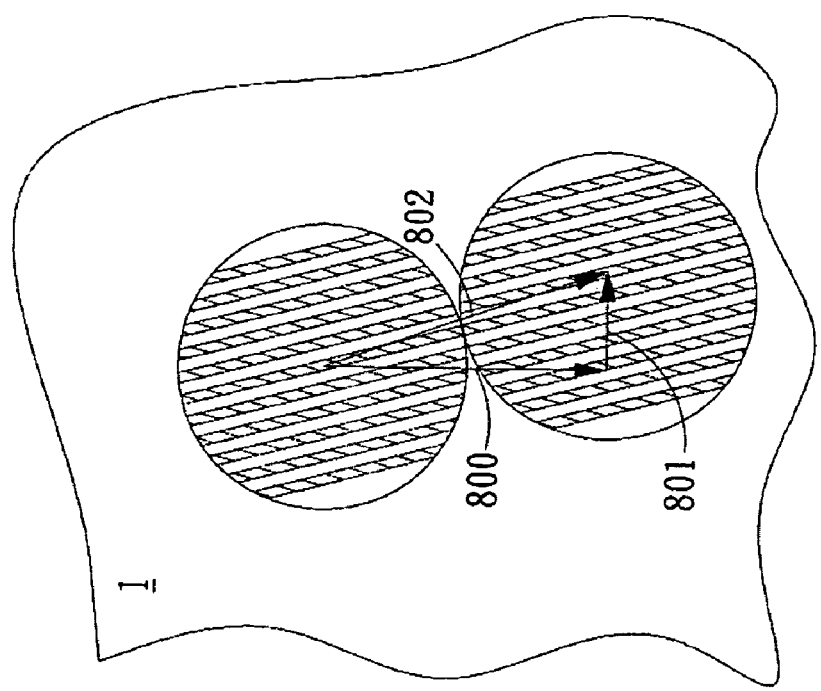
FIG. 5 is a schematic diagram showing how a position compensation is used for directing the stage driving unit to perform a movement for compensating a positioning error so as to accurate align the two interference patterns according to an exemplary embodiment of the invention.

After the displacement error is obtained, the step 22 of FIG. 2A can be proceeded. At step 22, the interference light beam is projected on a workpiece mounted on the carrier for forming a specific interference-patterned region on the workpiece; and then the flow proceeds to step 23. At step 23, a position adjustment is performed according to the displacement error in a stepwise manner so as to prepare the workpiece for a next formation of interference-patterned region; and then the flow proceeds to step 24. At step 24, an evaluation is performed to determine whether the formation of interference-patterned region is complete; if so, the flow proceeds to step 25; otherwise, the flow proceeds back to step 23. At step 25, a large-area interference pattern is complete by stitching the so-generated interference-patterned regions together. In an embodiment shown in FIG. 5, the position adjustment of the step 23 includes an adjusting movement in Y direction 800 and another adjusting movement in X direction 801, or can be an adjusting movement following an inclined direction 803. In addition, such displacement error can also be compensated by rotating the substrate by a specific angle, and then the workpiece is move in a stepwise manner following a Y direction or X direction defined by the Cartesian coordinate system of X-axis and Y-axis of FIG. 5 for prepare the workpiece for a next interference lithography.

Figure 6:
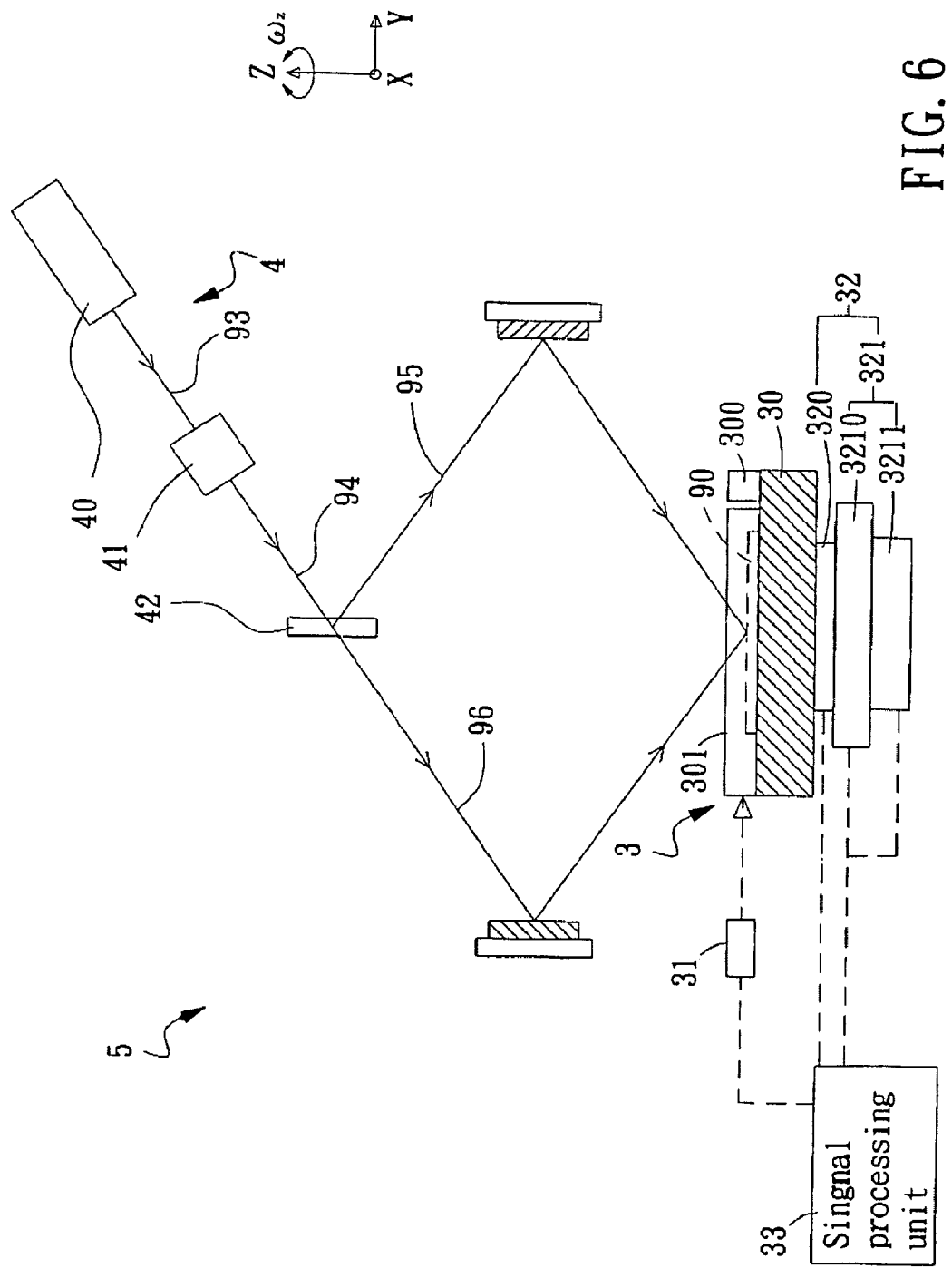
FIG. 6 is a schematic diagram showing a system for step-and-align interference lithography according to an exemplary embodiment of the invention.

Please refer to FIG. 6, which is a schematic diagram showing a system for step-and-align interference lithography according to an exemplary embodiment of the invention. In this embodiment, the interference lithography system 5 comprises: an interference lithography device 4 and an orientation device 3. Moreover, the interference lithography device 4 further comprises: a beam generator 40, for emitting a beam 93; a beam shaper 41; and a beam splitter 42. In an exemplary embodiment, the beam generator 40 can be a laser generator. In FIG. 6, after the beam 93 is being converted by the beam shaper 41 into a shaped beam 94, it is being projected toward the beam splitter 42 where it is first being divided into two beams 95, 96 of specific shapes, and then being directed to shine on a workpiece where the two beams 95, 96 are interfered to form an interference pattern on the workpiece 90, as the round-shaped interference pattern 97 shown in FIG. 7A. It is noted that the shape of the interference pattern is not limited to be a circle as the one shown in FIG. 7A, it can be shaped like a quadrangle or other polygons. As shown in FIG. 7A, in the range of the round-shaped interference pattern 97, there exists a plurality of microstructures 970. The method for forming an interference pattern of a specific shape is known to those skilled in the art and thus will not be described further herein.

Figure 8A:
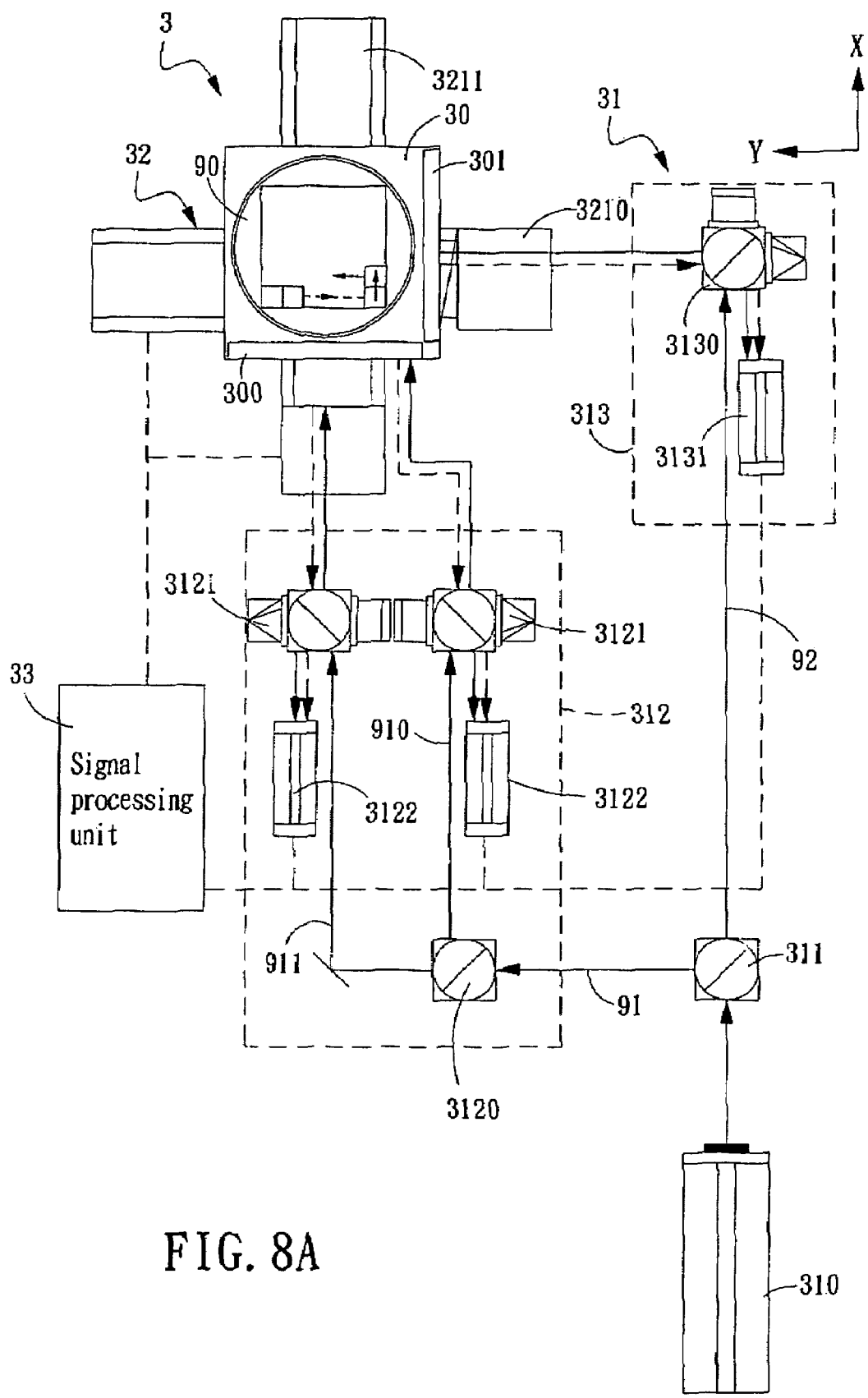
FIG. 8A is a top view of an orientation device used in a system for step-and-align interference lithography according to an exemplary embodiment of the invention.
Figure 8B:
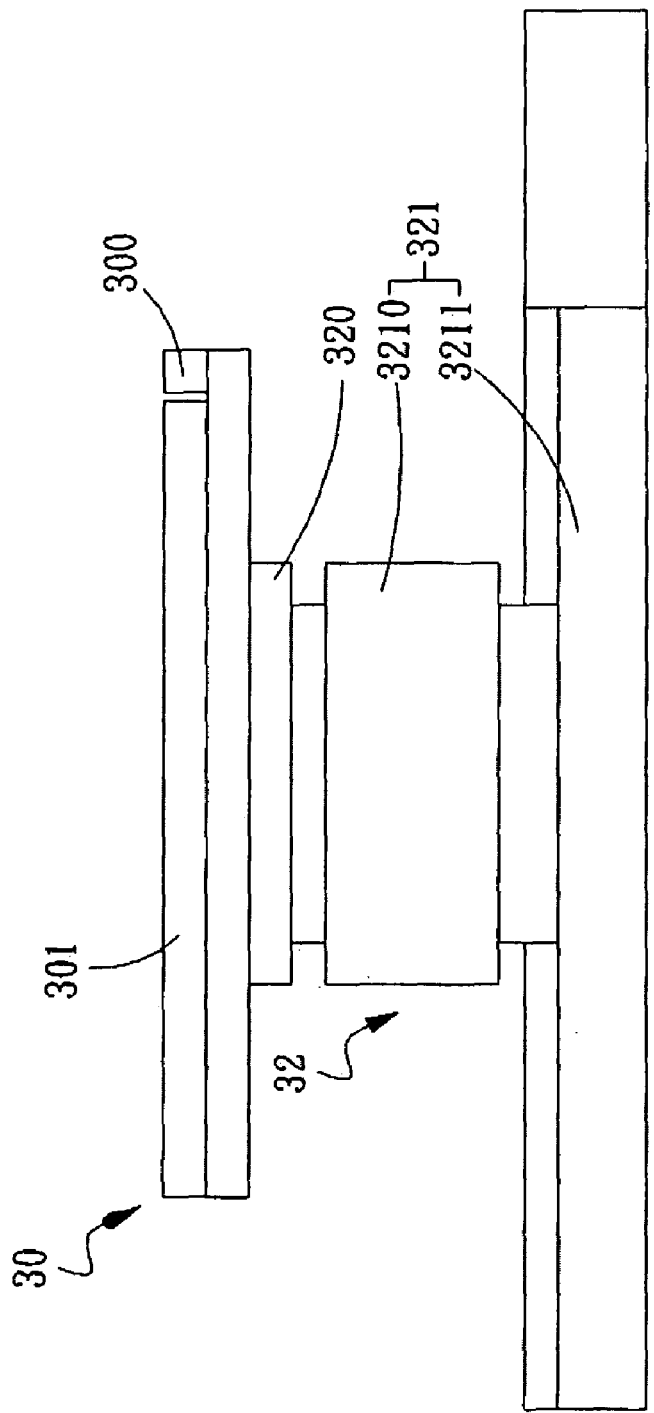
FIG. 8B is a side view of the orientation device of FIG. 8A.

Please refer to FIG. 8A and FIG. 8B, which are a top view and a side view of an orientation device used in a system for step-and-align interference lithography according to an exemplary embodiment of the invention. The orientation device 3 includes a carrier 30, a position detecting unit 31, a dual-actuating unit 32 and a signal processing unit. The carrier 30, being provided for a workpiece 90 to mount thereon, are configured with a first reflecting element 300 and a second reflecting element 301 in a manner that the two reflecting elements are arranged at two opposite sides of the carrier 30, i.e. in this embodiment, the longitudinal axis of the first reflecting element 300 is arranged at a side of the carrier 30 that is parallel with an X-axis of a Cartesian coordinate system while arranging the longitudinal axis of the second reflecting element 301 at another side of the carrier 30 that is parallel with the Y-axis, by which the first and the second reflecting elements 300, 301 are arranged orthogonal to each other and together forms an L-shaped structure. Moreover, in this embodiment, the first and the second reflecting elements 300, 301 are plane mirrors, whose surface roughness should be smaller than λ/10 whereas λ is the wavelength of a laser beam used for surface roughness detection.

Figure 9B:
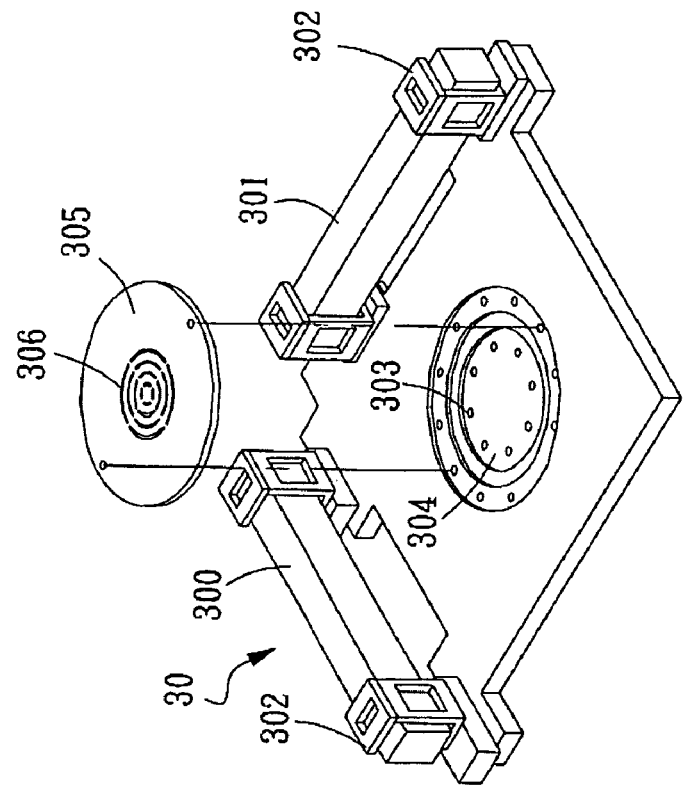
FIG. 9A and FIG. 9B are respectively a three-dimensional view and an exploded view of a carrier according to an exemplary embodiment of the invention.
Figure 9A:
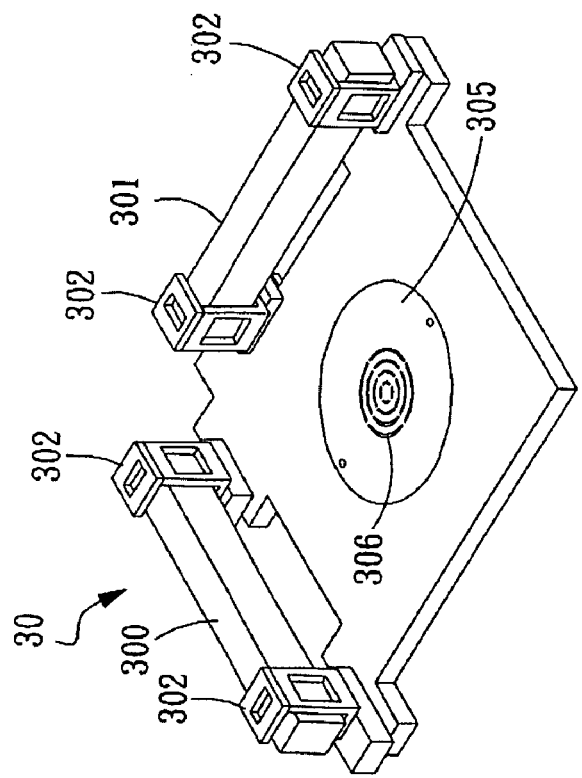
Figure 9C:
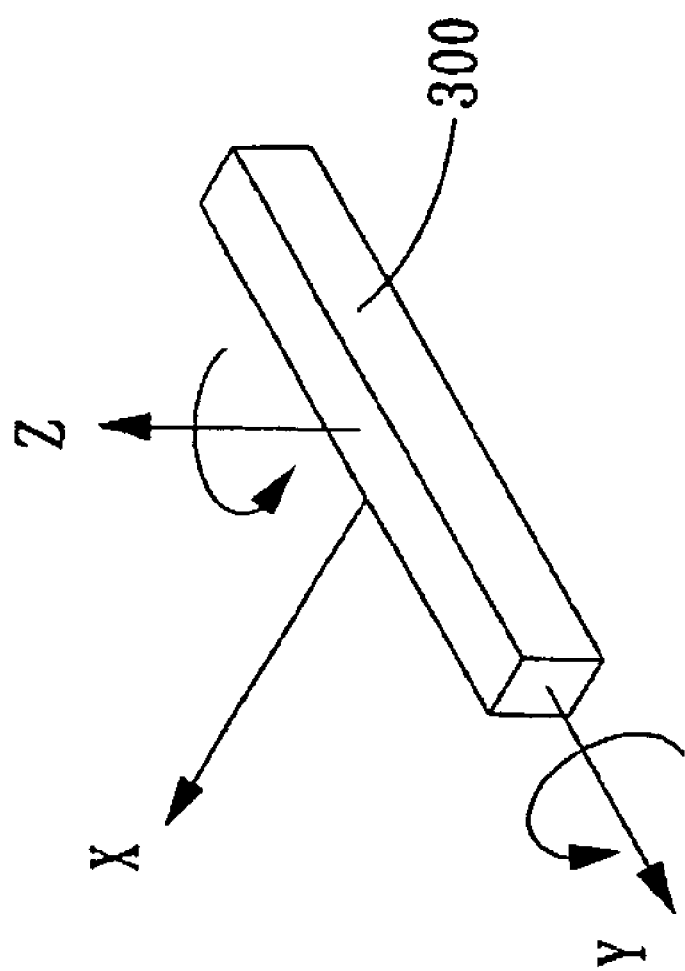
FIG. 9C is a schematic diagram showing how the first reflecting element or the second reflecting element can be moved in the present invention.

Please refer to FIG. 9A and FIG. 9B, which are respectively a three-dimensional view and an exploded view of a carrier according to an exemplary embodiment of the invention. In this embodiment, the first and the second reflecting elements 300, 301 are securely fixed on the carrier 30 by a fixing device 302. Moreover, the carrier 30 is formed with a recess 303, in which there are a plurality of via holes 304 being formed therein to be used for enabling a vacuum negative pressure to exert a suction force on the workpiece therethrough. As shown in FIG. 9B, the carrier 30 is further configured with a disc 305 in a manner that the disc 305 is received in the recess 303 to be provided for carrying the workpiece, and further the disc 305 is formed with a plurality of grooves 306, each capable communicating with the via holes 304 for enabling the suction force of the vacuum negative pressure to work on the workpiece. Please refer to FIG. 9C, which is a schematic diagram showing how the first reflecting element or the second reflecting element can be moved in the present invention. Taking the first reflecting element 300 shown in FIG. 9C for example, the first reflecting element 300 is able to turn and rotate about the Y-axis and the Z-axis of the Cartesian coordinate system defined in FIG. 9C in respective by the fixing device for adjusting the reflecting angle of the first reflecting element 300, by which the reflecting light path is adjusted.

As shown in FIG. 8A, the position detecting unit 31, being arranged at a side of the carrier 30, is capable of detecting the position of the carrier 30 and thus generating a position signal accordingly. The position detecting unit 31 includes a light source 310, a light splitter 311, a first detector 312 and a second detector 313. The light source 310 is used for providing a light beam, preferably a laser beam that is a He—Ne ruby laser beam in this embodiment. The light splitter 311 is capable of dividing the laser beam into a first detecting beam 91 and a second detecting beam 92, in which the detecting beam 91 is used in the detection of the rotation of the carrier 30 as well as its position measured along the X direction; and the second detecting beam 92 is used in the detection of the carrier's position measured along the Y direction.

The first detector 312 is arranged at a side of the carrier 30 at a position corresponding to the first reflecting element 300 in a manner that the first detector 312 is capable of dividing the first detecting beam 91 into two sub-beams 910, 911 and then guiding the two sub-beams 910, 911 to the first reflecting element 300 where they are reflected back to the first detector 312 and thus detected thereby; and the second detector 313 is arranged at another side of the carrier 30 at a position corresponding to the second reflecting element 301 in a manner that the first detector 313 is capable of guiding the second detecting beam 92 to the second reflecting element 301 where it is reflected back to the second detector 313 and thus detected thereby.

In this embodiment, the first detector 312 are configured with two plane interferometers 3121 and two photo-detecting receivers 3122 that each photo-detecting receiver 3122 is connected to its corresponding plane interferometer 3121 in respective; and the second detector 313 are configured with one plane interferometer 3130 and one photo-detecting receivers 3131. It is noted that all the aforesaid plane interferometers 3121, 3130 and photo-detecting receivers 3122, 3131 are device known to those skilled in the art that the plane interferometer can be the 10706B plane interferometer of the Agilent Corp., and the photo-detecting receiver can be the 10780C photo-detecting receiver of the Agilent Corp. By the aforesaid components, position and rotation angle can be measured by the manner as described in the following. A He—Ne laser beam, passing through a 33% light splitter, is divided into two beams that one is weaker while the other is more intense. One divided beam that is weaker is guided to travel through a No. 3 plane interferometer and project on an L-shaped mirror where it is reflected back to the No. 3 plane interferometer and thus is converted by a corresponding No. 3 photo-detecting receiver into an electric signal to be received by an encoding card-N1231A mounted on a personal computer; and another divided beam that is more intense is guided to travel pass another 50% light splitter where it is further being evenly divided into two beams while enabling the two beams to travel parallel with each other and passing through a No. 1 and a No. 2 plane interferometers in respective to project on their corresponding L-shaped mirrors where they are respectively reflected back to the No. 1 and No. 2 plane interferometers and thus are converted by their corresponding No. 1 and No. 2 photo-detecting receivers into electric signals to be received by the encoding card-N1231A. Consequently, by the use of the aforesaid electric signals, one can defined the positions and rotation angle intended to be measured as following:

$$positionX = \frac{D1 + D2}{2};$$
$$positionY - D3;$$

$$\text{rotation-angle} = \frac{D1 - D2}{L};$$

wherein D1 is the position measured and obtained by the sub-beam 910;
D2 is the position measured and obtained by the sub-beam 911;
D3 is the position measured and obtained by the second beam 92; and
L is the distance between the two plane interferometers 3121.

It is noted that the maximum resolution of the position detecting unit in this embodiment is $\lambda/2048$, in which $\lambda$ is the is the wavelength of the He—Ne laser beam, i.e. 632.99 nm. Thereby the maximum resolution is about 0.3 nm. In addition, the positions of the L-shaped reflecting elements 300, 301 are the keystones for defining the reference coordinate system for the whole system. Thus, all the adjustments of moving and rotation are based upon an original point defined by the L-shaped reflecting elements 300, 301, so that if an adjustment is within the reflection range of the L-shaped reflecting elements 300, 301, the position of the carrier as well as other corresponding structures can be accurately detected and determined.

The dual-actuating unit 32, being connected to the carrier 30, is capable of adjusting the position of the carrier 30 by performing a delicate adjustment and a coarse adjustment. The dual-actuating unit 32 comprises: a delicate stage driver 320, coupled to the carrier 30 to be used for performing the delicate adjustment; and a coarse stage driver 321, coupled to the delicate stage driver 320 to be used for performing the coarse adjustment upon the carrier 30. In this embodiment, the delicate stage driver is a piezoelectric actuator, but is not limited thereby. The piezoelectric actuator is capable of being used for rotating the carrier 30 about the Z-axis as well as driving the same to perform a linear movement in a plane define by the X- and Y-axial directions. It is noted that the aforesaid piezoelectric actuator is a device known to those skilled in the art that it can be the P-527.RCD piezoelectric actuator by Physik Instrument Corp. Such P-527.RCD piezoelectric actuator is a three-axial piezoelectric platform which has a maximum movable range of 200 μm in both X- and Y-axes, a rotation angle θ of ±2 mrad, and whose orientation resolution in X- and Y-axis is 0.3 nm with 0.1 μrad rotation angle. The driver of the three-axial piezoelectric platform is controlled by its corresponding controller, which includes PI gain controller and two sets of notch filters. When the controller is activated for feedback control, the orientation resolution in X- and Y-axis is 2 nm with 0.3 μrad rotation angle, using 5 KHz sampling frequency. The sampling frequency for the capacitive position sensor inside the piezoelectric platform is 20 KHz.

As the coarse stage driver 321 is used for performing the coarse adjustment, the referring coarse adjustment is to control the carrier 30 to move in a relative long stroke. The coarse stage driver 321 further comprises a first linear driver 3210 and a second liner driver 3211. The first linear driver 3210 is coupled to the delicate stage driver 320; while the second linear driver 3211 is coupled to the first linear driver 3210 in a manner that it is arranged orthogonal to the first linear driver 3210. In this embodiment, the first linear driver 3210 is used for driving the carrier 30 to move in the X-axis while the second linear driver 3211 is used for driving the carrier 30 to move in the Y-axis. Generally, the first or the second linear drivers 3210, 3211 is a device composed of motors and screw rods, but is not limited thereby. In this embodiment, the first and the second linear drivers 3210, 3211 can be the M521.DD linear driving device of Phisik Instrument Crop. As the linear error of the coarse stage driver 321 is about 1 μm/100 mm that it can achieve an error of more than several μms, such μm-graded error should be overcome be the delicate stage driver 320.

Figure 10:
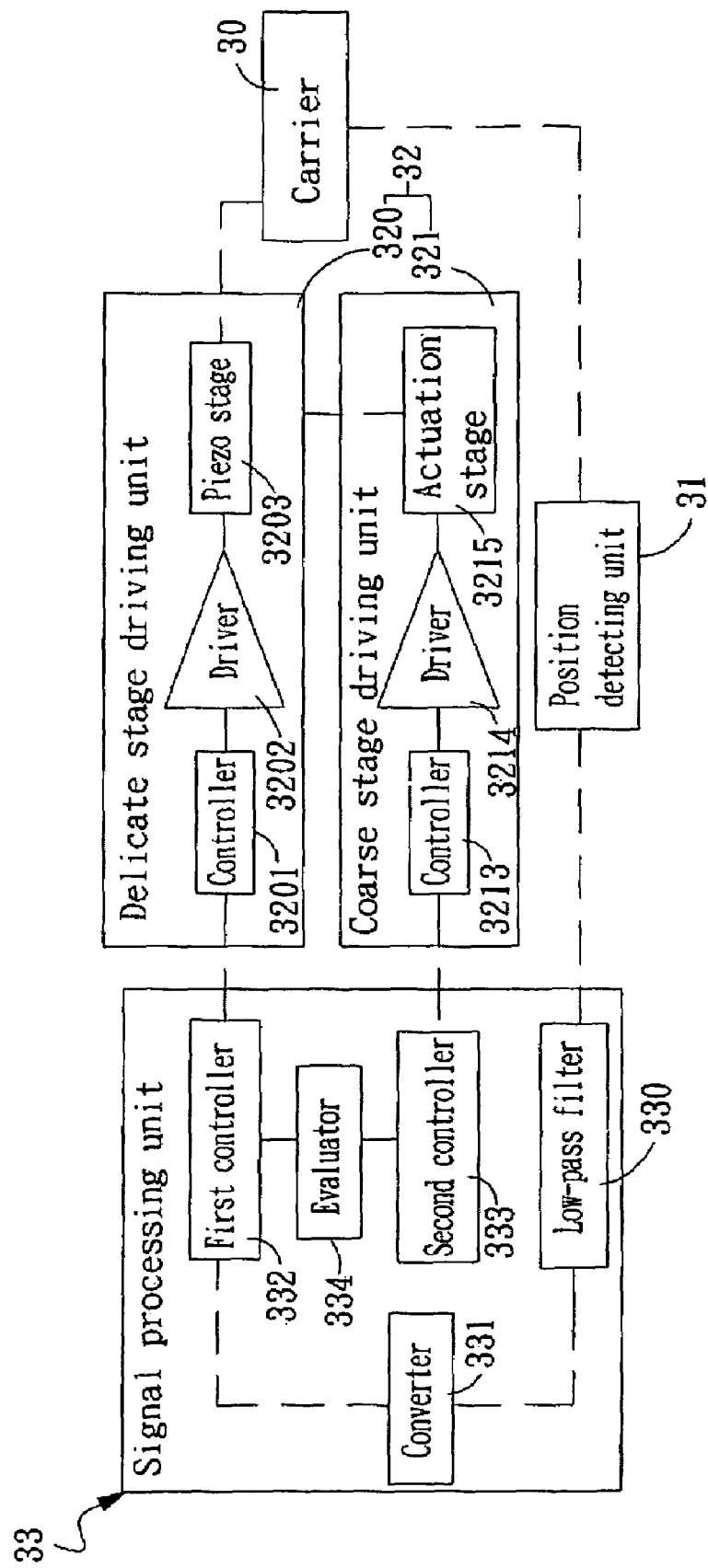
FIG. 10 is a block diagram showing an orientation device of the invention.

The signal processing unit 33, being coupled to the position sensing unit 31 and the dual-actuating unit 32, is used for receiving and thus processing the position signal so as to generate a position control signal accordingly. Then, the signal processing signal 33 is enabled to calculate a positional compensation basing upon the position control signal and then control the dual-actuating unit 32 to perform the delicate adjustment directly according to the position compensation while basing on the positional compensation to determine whether the coarse adjustment should be performed Please refer to FIG. 10, which is a block diagram showing an orientation device of the invention. As shown in FIG. 10, the signal processing unit 33 is comprised of a low-pass filter 330, a converter 331, a first controller 332 and a second controller 333. The low-pass filter 330 is used for filtering the position signal and thus generating a filter signal. As the working frequency of the delicate stage driver 320 is different from that of the coarse stage driver 321, not only the unwanted high frequency can be filtered out by the low-pass filter 330, it can also re-arrange and re-distribute the working bandwidth for the delicate and the coarse stage drivers 321, 321. Moreover, the low-pass filter 330 can filter and thus eliminate the aliasing signal caused by the high-frequency laser signal used by the delicate stage driver 321 for sampling the position sensing unit 31. The converter 331 is used for performing a coordinate transformation operation upon the filter signal for converting the same into a position control signal. Since the present invention should achieve a nano-scaled accuracy, it is required to converted the filter signal for transforming the same into an absolute coordinate system so as to obtain a position control signal that can represent the exact current position of the carrier.

The first controller 332 is used for receiving the position control signal while comparing the received position control signal with the position of the carrier so as to generate a position compensation signal, and then using the position compensation signal to generate a delicate adjustment signal correspondingly to be used for controlling the delicate stage driver 320 of the dual-stage actuating unit 32 to perform the delicate adjustment upon the carrier 30. By comparing the position control signal with the target position and rotation angle of the carrier 30 so as to thus obtain the displace difference relation to the position and the rotation, the first controller 332 is able to generate the position compensation signal accordingly whereas the position compensation signal basically can be divided into two parts, one of which relates to the generating of the delicate adjustment signal for the delicate stage driver 320, while another part relates to the controlling of the coarse stage driver 321.

As soon as the position compensation signal is generated by the first controller 332, the amount of adjustment required to be performed by the delicate stage driver 320 can be calculated and known which is then being converted into the corresponding delicate adjustment signal to be transmitted to the delicate stage driver 320. Basically, the delicate stage driver 320 includes three parts, which are a controller 3201, a driver 3202 and a piezoelectric stage 3203. When the delicate adjustment signal is received by the controller 3201, it will decode the signal into signal for controlling the piezoelectric stage 3203 to move accordingly, as such the decoded signal will first being send to the driver 3202 from the controller 3201 for enabling the driver 3202 to move the piezoelectric stage 3203. Moreover, as the piezoelectric stage 3203 is connected to the carrier 30, the movement of the piezoelectric stage 3203 is going to move the carrier 30 consequently.

During the actuating of the delicate stage driver 320, the position compensation signal will also be send to an evaluator 334 where it is evaluated to determine whether the coarse stage driver 321 should be activated for performing the coarse adjustment. If the evaluator 334 decides that the coarse adjustment is required, it will issue a trigger signal to the second controller 333 for activating the same to generate a coarse adjustment signal according to the position compensation signal to be used by the coarse stage driver 321 for perform the coarse adjustment. As shown in FIG. 8A, the coarse stage driver 321 is composed of two linear drivers 3210, 3211. However, there is only one linear driver 3214 being shown in the coarse stage driver 321 of FIG. 10 for illustration purpose. In FIG. 10, the coarse stage driver 321 includes three parts, which are a controller 3203, a driver 3214 and an actuation stage 3205. When the coarse adjustment signal is received by the controller 3213, it will decode the signal into signal for controlling the actuation stage 3215 to move accordingly, as such the decoded signal will first being send to the driver 3214 from the controller 3213 for enabling the driver 3214 to move the actuation stage 3215. In prior art, the actuation stage 3215 is usually connected to a screw rod while the screw rod is further connected to a motor, so that by controlling the rotation of the motor, the advance of the actuation stage 3215 can be controlled. In addition, as the actuation stage 3215 is connected to the delicate stage diver 320 while the delicate stage driver 320 is further connected to the carrier 30, the advance of the actuation stage 3215 the movement of the piezoelectric stage 3203 is going to cause the carrier 30 to move consequently.

From the above description, it is noted that the control signal of the signal processing unit 33 is capable of respectively and simultaneously controlling instruments that respond to different working frequencies. For instance, although the coarse stage driver 321 and the delicate stage driver 320 are only responding to their specific working frequencies and control commands, those different working frequencies and control commands can be integrated by the signal processing unit 33 so that the signal processing unit 33 is able to issue control signal for different stage drivers and thus control the same to perform various position adjustment. In this embodiment, the dual-actuation unit 32 of the invention which has a maximum movable range of 200 mm in both X- and Y-axes, with a displacement error of ±20 nm in both X- and Y-axes and a rotation error ranged within 0.1 μrad.

By the interference lithography system shown in FIG. 6, a plurality of interference-patterned regions 97 can be formed, as those shown in FIG. 7A, by a series of continuous interference lithography processes and thus the so-generated interference-patterned regions are accurate aligned with one another on a workpiece 90 like a wafer for preparing the same to be stitched together to form a two-dimensional large-area interference pattern. FIG. 7B only reveals a portion of the workpiece 90. As the workpiece 90 is disposed on the carrier 30 which can be driven to move a distance D in a stepwise manner by the control of the dual-actuating unit 32, the carrier 30 can be move exactly on the target position under the condition that the displacement error relating to the moving of an interference light beam is accurately compensated, by that the workpiece 90 is prepared and ready for the step 23 and step 24 shown in FIG. 2. After a plurality of interference lithography process is performed on the workpiece 90 by the interference lithography system 5 of FIG. 6, the so-generated interference-patterned regions can be stitched together on the workpiece 90 to form a large-area pattern. Moreover, by the orientation device of FIG. 8A and the method depicted in FIG. 2B for determining the displacement error, the interference lithography unit 4 can be used to form the series of continuous interference-patterned regions 900~905 as the carrier is moved stepwisely corresponding with the compensation of the displacement error, as those shown in FIG. 7A.

Figure 11A:
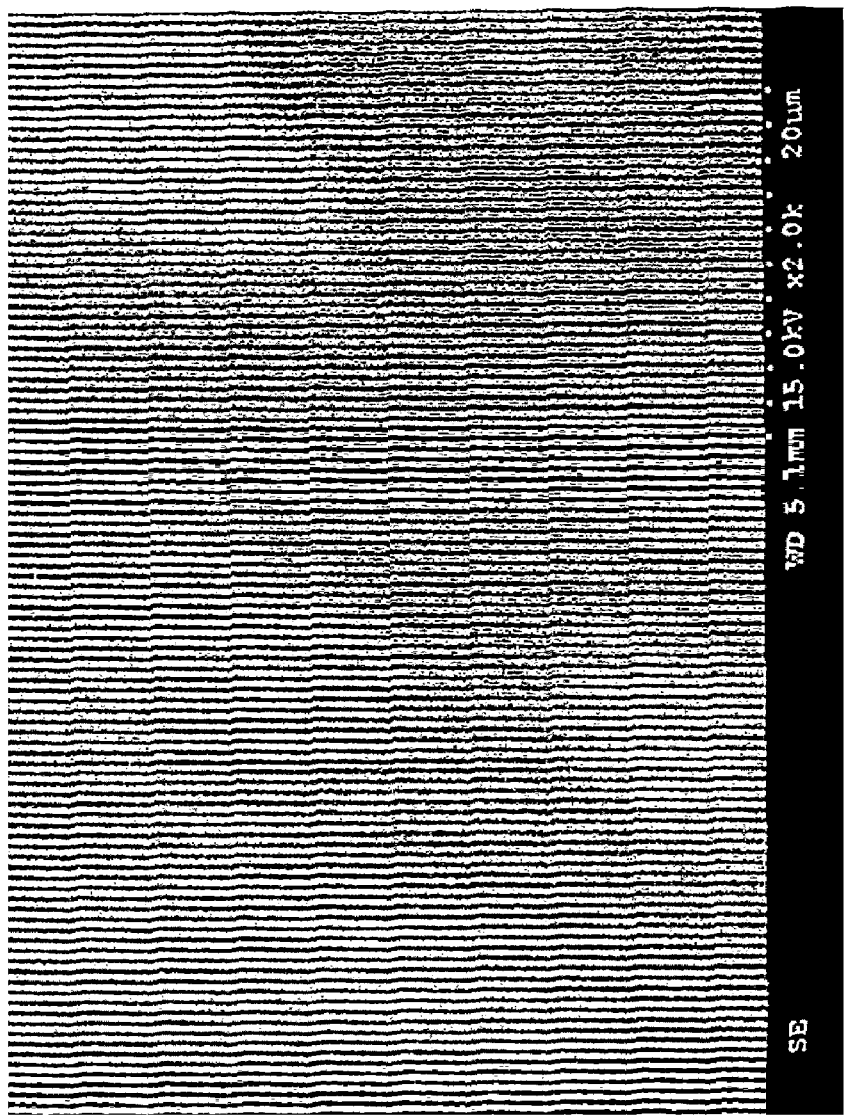
FIG. 11A and FIG. 11B are two images of interference patterns formed on the workpiece.
Figure 11B:
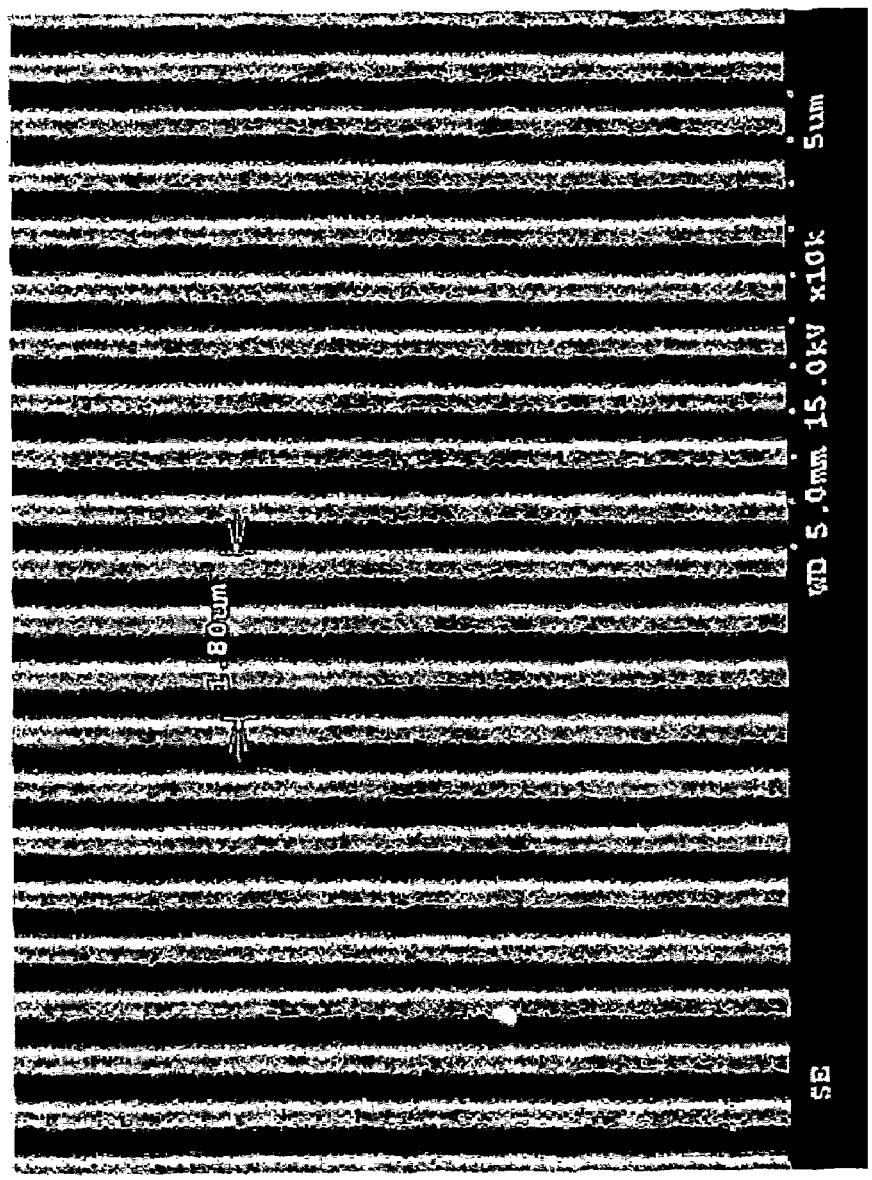

In FIG. 7A, as each interference-patterned region is shaped like a circle, it is inevitable that there will be area not covered by the series of continuous interference-patterned regions 900~905 so that it is required to use the high-precision displacement control of the orientation device 3 to form the two interference-patterned regions 906, 907 in series for covering those uncovered areas and eventually form a large-area lithograph pattern covering the whole workpiece 90. Please refer to FIG. 11A and FIG. 11B, which are two images of interference patterns formed within the region 908 defined in the workpiece 90. As shown in FIG. 11A, although the region 908 is processed by multiple interference lithography and is patterned by the stitching of difference interference-patterned regions 904, 907, all the fringes in the region 908 are perfectly aligned, that is also true even by amplifying the region 908, as those shown in FIG. 11B. Therefore, it is concluded that by the method depicted in FIG. 2A and FIG. 2B, the interference lithography system 5 of the invention is capable of accurate aligning the so-generated interference-patterned regions with one another on a two-dimensional plane and thus stitching those together to form a two-dimensional large-area periodic structure.

To sum up, the present invention provides a method and system for step-and-align interference lithography, which can use a coarse adjustment operation and a delicate adjustment operation to control the moving of a carrier while compensating the displacement error relating to the moving of an interference light beam, and thus achieves nano-scaled precision for forming large-area interference pattern on a workpiece.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for step-and-align interference lithography, comprising the steps of:
   (a) providing a carrier capable of moving in a first axial direction and a second axial direction as well as rotating about the same;
   (b) providing an interference light beam while detecting a displacement error of the interference light beam relating to the moving of the carrier;
   (b1) disposing a position sensor on the carrier;
   (b2) projecting a first beam of the interference light beam on the position sensor while forming a lighting area thereon and registering a first position relating to the lighting area;
   (b3) controlling the carrier to move a specific distance along the first axial direction while registering a second position relating to a lighting area being formed by projecting a second beam of the interference light beam on the position sensor;
   (b4) calculating a position difference between the first and the second position with respect to the second axial direction; and
   (b5) calculating the ratio between the position difference and the specific distance so as to obtain the displacement error basing upon the obtained ratio;
   (c) enabling the interference light beam to project on a workpiece mounted on the carrier for forming a specific interference-patterned region on the workpiece;
   (d) performing a position adjustment according to the displacement error in a stepwise manner so as to prepare the workpiece for a next formation of interference-patterned region; and
   (e) repeating the execution of the step (c) to step (d) for multiple times so as to form a large-area interference pattern by stitching the so-generated interference-patterned regions together.

2. The method of claim 1, wherein the step (d) further comprises the steps of:
   (d1) basing on the displacement error to rotate the carrier by a specific angle; and
   (d2) adjusting the position of the carrier for interference lithography in a stepwise manner.

3. The method of claim 1, wherein the step (d) further comprises the steps of:
   (d1) driving the carrier to move along the first axial direction in a stepwise manner; and
   (d2) driving the carrier to move along the second axial direction in a stepwise manner for compensating the displacement error.

4. The method of claim 1, wherein the position adjustment of the carrier includes a delicate adjustment and a coarse adjustment.

5. The method of claim 1, wherein the diameter of the lighting region being detected is equal to the width of a sensing area of the position sensor.

* * * * *